United States Patent [19]
Hynecek

[11] Patent Number: 4,577,232

[45] Date of Patent: Mar. 18, 1986

[54] LINE ADDRESSED CHARGE COUPLED IMAGER

[75] Inventor: Jaroslav Hynecek, Richardson, Tex.

[73] Assignee: Texas Instruments Incorporated, Dallas, Tex.

[21] Appl. No.: 646,400

[22] Filed: Aug. 31, 1984

[51] Int. Cl.$^4$ .............................................. H04N 3/14
[52] U.S. Cl. ..................................... 358/213; 357/24; 358/44
[58] Field of Search ................... 358/44, 213, 48, 209, 358/134, 212; 357/24 LR, 24; 250/578, 211 J

[56] References Cited

U.S. PATENT DOCUMENTS

| | | | |
|---|---|---|---|
| 4,057,830 | 11/1977 | Adcock | 358/127 |
| 4,065,785 | 12/1977 | Adcock et al. | 358/44 |
| 4,229,752 | 10/1980 | Hynecek | 357/24 |

*Primary Examiner*—Gene Z. Rubinson
*Assistant Examiner*—Robert G. Lev
*Attorney, Agent, or Firm*—Carlton H. Hoel; Robert O. Groover; James T. Comfort

[57] ABSTRACT

This specification discloses a CCD imager which includes a line addressing circuit (24) which selectively addresses CCD imaging gates (48). Output signals are clocked under the gates (48) to a buffer register (30) which is constructed in the form of a tree. Signals from under each of the CCD gates (48) travel an identical length path through the buffer register (30) to a charge detection circuit (46) measured by the number of pixels involved. The output signals thus take the same time, or same number of clock pulses, to travel the length of the buffer register (30) to enable all line switching to be accomplished during the horizontal blanking time of a television thus eliminating the switching noise from the television screen.

15 Claims, 3 Drawing Figures

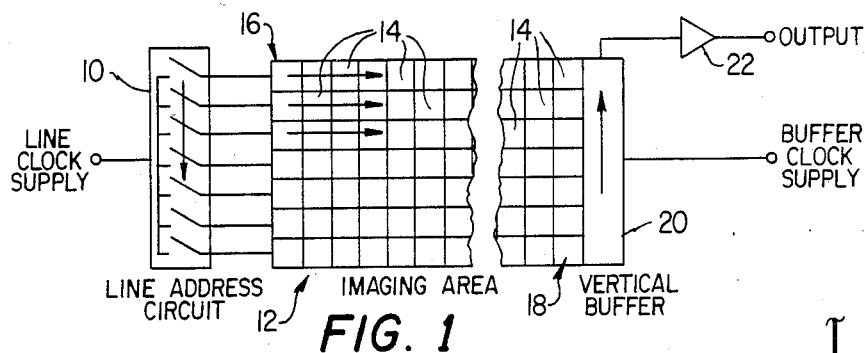
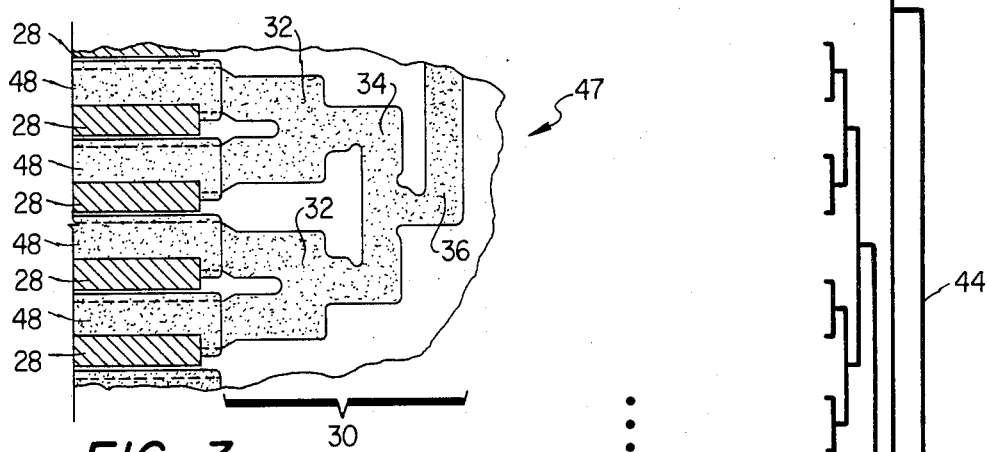
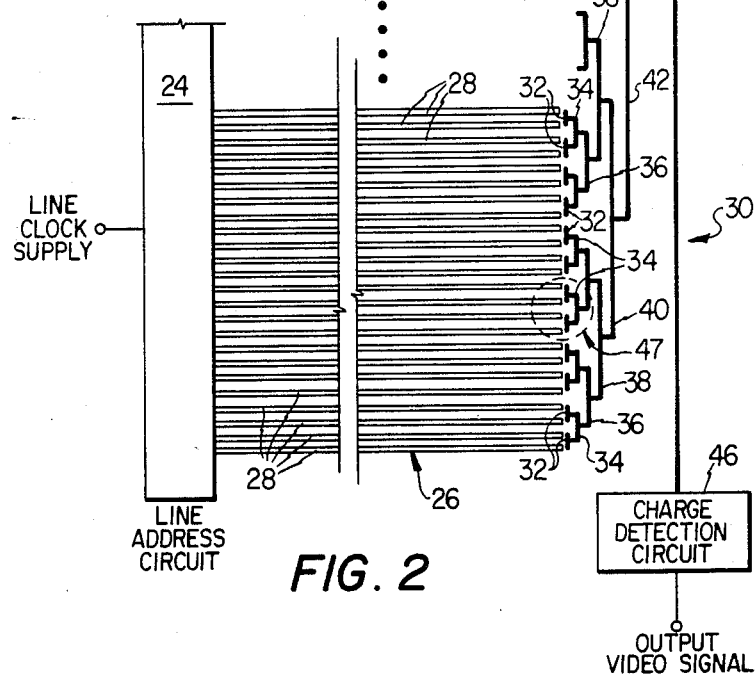

LINE ADDRESSED CHARGE COUPLED IMAGER

TECHNICAL FIELD OF THE INVENTION

This invention relates to charge coupled device arrays, and particularly relates to imaging arrays comprising a plurality of lines of charge coupled devices which are selectively addressed.

THE PRIOR ART

Charge coupled devices (CCDs) have been heretofore commonly used in imaging arrays in order to provide the video signal output for video cameras utilized with television systems and the like. CCD imagers normally include an imaging or image pick up area and a shift register-type read-out area. The imaging areas normally comprise a plurality of horizontal lines, each line including a plurality of serially connected CCDs or pixels. The pixels collect charge signals in dependence upon incident light, the signals from the horizontal lines being sequentially read out through the read-out area.

Two widely known CCD imager architectures include the frame transfer and the interline transfer techniques. Both of these techniques utilize additional memory pixels to temporarily store signal charge in order to accomplish a read-out compatible with a standard television system while a fresh signal charge is being integrated in the imaging array.

Alternate CCD imager architecture has been proposed which is called the line addressed CCD imager which eliminates the memory pixels of the frame and interline transfer devices, thus improving the device performance and/or lowering the cost by more efficient utilization of chip area. The line addressed CCD imager includes an array of horizontal pixel lines, with line address circuitry which may individually address selected horizontal pixel lines. The charge signals from an addressed pixel line are then clocked out to a vertical buffer register while the unselected pixel lines are used to integrate new charges. The vertical buffer register is provided at the output ends of the array to transport the charge signals from the end of each pixel line to an output amplifier.

Although providing advantages, line addressed CCD arrays have not been heretofore commonly utilized because the prior addressing circuitry has been complicated to design and construct and because the vertical buffer register must transport signal charge from each horizontal pixel line to the output amplifier over different distances. For example, charge input into the vertical buffer register from the top of the array must travel a different distance along the vertical buffer register than charge input from a pixel line at the bottom of the array. This difference in travel time of charge signals results in timing often incompatible with standard television format, since the vertical buffer register must provide different clocking for each different horizontal pixel line in order to compensate for the inherent delay caused by the different charge travel paths. Such variable clocking introduces often intolerable transients into the video during the active read out time of the television system.

BACKGROUND OF THE INVENTION

In accordance with the present invention, a CCD imager architecture is provided which enables the use of line addressed arrays for standard television formats by equalizing the travel time and distances for each charge output from the imaging array.

In accordance with another aspect of the invention, a CCD imager includes an array of charge transfer locations arranged in a plurality of horizontal rows. A buffer register is disposed along one end of said array for receiving charge propagated from the rows. An output amplifier is connected to the buffer register for receiving charge propagated along the buffer register. The length of the path traveled by each charge along the buffer register, and measured in number of pixels to the output amplifier is equal, thereby providing equal travel time for each charge output from the imager array or equal number of pulses to clock.

In accordance with another aspect of the invention, virtual phase CCDs are utilized for the CCD registers of the array and for the vertical buffer register, thereby simplifying the design and construction of the imager without degrading the performance thereof.

DESCRIPTION OF THE DRAWINGS

For a more detailed explanation of the present invention and the advantages thereof, reference is now made to the following description taken in conjunction with the following Drawings, in which:

FIG. 1 is a diagrammatic illustration of a prior art line addressed CCD array;

FIG. 2 is a plane view of the present imager array illustrating the identical travel paths provided for charge in the vertical buffer register; and FIG. 3 is an enlarged plane view of a portion of the vertical buffer register shown in FIG. 2.

DESCRIPTION OF THE PREFERRED EMBODIMENT

FIG. 1 is a somewhat diagrammatic view of a prior array line addressed CCD imaging system. Such imagers are previously known, and include a line address circuit which receives clock signals from a line clock supply. The line addressing circuit comprises a plurality of switches which are selectively addressable to selectively apply line clock supply signals to desired imager lines. The imaging area or array is designated generally by the reference numeral 12 and comprises a plurality of horizontal lines or rows of CCD or imaging pixels. The imaging area can include a wide variation of numbers of lines and pixels per line, depending upon the ultimate desired use of the array. For illustration purposes, upper line 16 and bottom line 18 of the array are indicated.

The vertical buffer register 20 extends along the output ends of the imager lines to receive the output charges therefrom. The vertical buffer register 20 may comprise a CCD serial register which is clocked by a buffer clock supply in order to clock the charges upwardly to an output amplifier 22. The output of amplifier 22 is then applied to suitable processing circuitry and from thence to an output device such as a television display or the like.

The construction and operation of the prior imaging system and the CCDs used therein shown in FIG. 1 are well-known and will not be described in substantial detail. Description of prior CCDs and CCD imagers may be found in a wide variety of prior publications including U.S. Pat. Nos. 4,057,830 and 4,065,785 granted to Willis A. Adcock and in U.S. Pat. No. 4,229,752 issued to Jaroslav Hynecek and assigned to Texas Instruments Inc., the above patents being incorporated herewith by a reference.

In operation of such prior systems shown in FIG. 1, the switches within the line addressing circuit 10 are selectively operated to apply line clock signals to different horizontal lines of the array 12. For example, line clock signals may be applied to the lower-most horizontal line 18, such that signals representative of light intensity impinging on the line pixels are sequentially clocked out of line 18 into the vertical buffer register 20. After signals have been clocked from line 18, the succeeding lines are clocked until the upper-most line 16 is clocked.

A careful review of FIG. 1 will indicate that signals from the lower-most line 18 must travel along the entire length of the vertical buffer register 20 before being applied to the output amplifier 22. Conversely, the output signals from line 16 are not required to traverse the entire length of the vertical buffer register 20, but travel a much shorter path to the output amplifier 22. As a matter of fact, the output signals from each of the horizontal lines are required to travel different distances through the vertical buffer register 20 than the distances traveled by the signals from the remaining lines. It will thus be seen that the time of travel of the output signals and therefore number of clock pulses to be applied to the buffer register for each line is different from the remaining lines because of different travel distances. The travel distance is measured by number of pixels located along the buffer register. This time difference creates serious clocking and timing problems, tending to make such systems incompatible with standard television format, since the vertical buffer register is required to begin clocking earlier for each subsequent addressed line to compensate for the delays. This causes complex clocking problems and causes intolerable transients to be introduced into the video during the active read-out time of the television system.

With the use of such prior systems, clock switching of the horizontal line registers is required while reading of the signal is occurring at the output amplifier 22. This tends to produce undesirable noise effects on the television screen. An advantage of the present invention is that address line switching of the array occurs only during the horizontal blanking time of the television system to prevent the generation of noise which affects picture quality.

FIG. 2 illustrates a top view of the present invention, wherein output signals from each horizontal line travel through the same number of pixels during equal time intervals to the output amplifier. Referring to FIG. 2, a line clock supply is applied to a line address circuit 24 which selectively applies clock signals to any one of horizontal rows of CCDs or pixels comprising the imaging area 26. The imaging area 26 includes metal leads 28 such as aluminum, which are formed over a layer of polysilicon to apply the clocking signals to the gates of CCD pixels disposed along each horizontal line.

A buffer register 30 is illustrated as comprising an architecture having a "tree" configuration, such that each path along the tree is equal in number of pixels. First branches 32 of the buffer register 30 bridge the ends of pairs of the horizontal CCD lines. Second branches 34 connect adjacent pairs of the branches 32. Third branches 36 connect adjacent pairs of branches 34. Fourth branches 38 connect adjacent pairs of branches 36. Finally, branch 40 interconnects adjacent pairs of branches 38. Branch 40 is connected with line 42 which may interconnect with additional branches 40, depending upon the size of the imaging area 26. In a similar manner, line 42 is connected with line 43, which may also interconnect with additional lines 42 to further allow interconnection with other portions of the imaging area 26. Line 43 is interconnected to an output line 44 which leads to a charge detection circuit 46, which may comprise the output amplifier for producing an output video signal for application to a television screen or the like.

Referring to FIG. 2, it is seen that each output signal from each horizontal line passes first into one end of a branch 32 and travels half the length of the branch 32 and then travels into a second branch 34. The signal travels one-half of a branch 34 and then passes into a third branch 36. The signal travels half the length of a branch 36 and passes into a branch 38 and then into branch 40. The signal travels half the length of branch 40 and flows into line 42 and output line 44 to the charge detection circuit 46. Each signal from the array thus travels the identical number of pixels in the buffer register 30 and thus takes the same travel time, or same number of clock pulses, to the charge detection circuit 46. This greatly simplifies clocking for the system and advantageously suits the system for use with a television display.

It will be understood that underneath each of the gates 48 lies a plurality of CCD pixels for storing charge dependent upon the light intensity upon the pixels and for then clocking the stored charge along the horizontal register to the buffer register 30. Pixels of the buffer register 30 are covered by a gate similar to the gate 48 not shown in FIG. 3 for simplification. A wide variety of CCDs are applicable for use with the present invention, and will thus not be described in detail. Individual pixels are approximately evenly spaced along buffer register 30 such that each signal passes through the same number in its travel to the charge detection circuit 46. It is not necessary that the pixels have the same shape and size. Conventional CCDs may also be used for the output buffers or registers throughout the buffer register 30 and will also not be described in detail as they are well-known.

The line address circuit may comprise any one of a number of known addressing schemes. For example, the line addressing circuit may be constructed of field effect transistors in the manner shown in U.S. Pat. No. 4,242,700 issued to Paul K. Weimer on Dec. 30, 1980. Other line address techniques are illustrated in U.S. Pat. No. 4,291,239 issued to Paul K. Weimer on Sept. 22, 1981. The two Weimer patents also disclose CCD structure comprising upper and lower levels of polysilicon forming gate electrodes for CCD output registers which are suitable for use for the register buffer 30 of the present invention. Other conventional CCD register circuitry and other equivalent sequential charge storage stages are also suitable for use in the buffer register 30.

Although the present imaging array 26 is illustrated as comprising a plurality of horizontal lines, it will also be understood that the imaging array may utilize interlacing two-dimensional arrays of space charge storage islands that communicate with one another through charge transfer regions, such that storage islands are arranged in spaced rows with each island of each row being coupled through respective individual transfer regions to each first and second neighboring island of an adjacent row on both sides thereof. Such interlacing architecture is described in the above-described Weimer patents and disclosure of the Weimer patents is incorporated herein.

It is to be understood that FIG. 2 does not illustrate conventional dark reference pixels or antiblooming gates or drains which may be incorporated in the array according to well-known techniques.

FIG. 3 illustrates an enlarged view of a portion 47 (FIG. 2) of the buffer register 30, with gate and clocking bus lines omitted for clarity. The ends of the metal bus leads 28 are seen to terminate adjacent to one end of a first branch 32 of the buffer register tree. The CCD gates 48 are shown beneath each of the bus leads 28 and in association with one end of a first branch of a CCD channel 32. Each first branch 32 bridges adjacent lines of the pixel array. Branches 34 are illustrated as interconnecting adjacent pairs of branches 32, while branch 36 is illustrated as interconnecting adjacent pairs of branch 34. Branches 36 connect to additional branches as shown in FIG. 2. The pixels of the buffer register 30 are spaced approximately evenly along the branches 32, 34, 36, but do not have to have the same size or shape. The details of the pixel construction have been omitted for simplicity and can be found in U.S. Pat. No. 4,229,752. The gate that covers the CCD channel is similar to gate 48 and has been omitted for simplicity in the buffer register 30. It may be seen that regardless of which array line generates a signal, the signal travels the identical path that all other signals in the buffer register 30 travel. Although it will be understood that various dimensions and types of CCDs may be utilized with the invention, a typical dimension of a CCD cell for use with the invention may be approximately 12 microns in length and 14 microns in width. The individual CCD pixels in the imaging array under the gate 48 are also not illustrated in detail in FIG. 3 as the construction thereof is well-known.

It will be understood that various total lengths of the buffer register may be utilized. However, a very advantageous configuration for use with television is that the length of travel of the buffer register 30 is the same length as a single horizontal line 26. This structure enables one complete line of signals to be loaded into the buffer register 30 at one time while a line of signals is being read from the buffer register to the charge detection circuit 46, thereby simplifying clocking and timing operation.

Specifically, during a television line read-out, the signal charge on the buffer register 30 is clocked into the charge detection circuit or output amplifier 46. At the same time, a new series of signals from a line of the array is loaded into the buffer register 30. The appropriate line to be loaded into the buffer register 30 is selected by proper operation of the line address circuit 24 during the blanking interval of the television system. As noted, the clocking of the signal from the buffer register into the charge detection circuit 46 is simplified because the same number of clock pulses is required to clock signals from each line through the buffer register 30. The address switching by the line address circuit 24 occurs during the horizontal blanking time of the television, which eliminates the generation of undesirable noise. In addition, with use of the present technique, any line of the array may be read out in any sequence desired. For example, every other line might be read out and then subsequently, the alternate lines read out. For special purposes such as still photography or the like, the present invention is particularly advantageous because particular line read-out schemes may be utilized without the requirement of separate memory for storage of frame data while recording earlier data.

Another important aspect of the invention is the use of virtual phase CCDs (VP CCDs) which may be formed with one layer of metalization. The construction and operation of VP CCDs are well-known and are described, for example, in U.S. Pat. No. 4,229,752 entitled "Virtual Phase Charge Transfer Device", issued Oct. 21, 1980, by the present applicant, and in the publication "Virtual Phase Technology: A New Approach to Fabrication of Large-Area CCD's" by applicant, published in *IEEE Transaction on Electronic Devices,* Volume ED-28, No. 5, May, 1981.

Fabrication processes compatible with virtual phase CCDs (VP CCDs) may be utilized to form the line address system circuit 24, as well as to form the individual storage locations along the buffer register 30. With the use of the uniphase technology of the VP CCD, only one clock line is required for each horizontal register, thus significantly simplifying the design of the line addressing circuit. The VP CCD requires only one level of interconnects which provides simplified construction and operation of the system, without crossover levels required.

Although the preferred embodiment has been described in detail, it should be understood that various changes, substitutions and alterations can be made therein without departing from the spirit and scope of the invention as defined by the appended Claims.

What is claimed is:

1. A charge transfer imager comprising:
   an array of charge transfer locations arranged in a plurality of rows;
   a buffer register disposed at one end of each said rows for receiving charge propagated from said rows;
   output means connected to said buffer register for receiving charge propagated along said buffer register, and
   the length of the path traveled by each charge along said buffer register to said output means being equal as measured by number of pixels traveled.

2. The imager of claim 1 wherein the length of the path traveled by each charge along said buffer register is equal to the length of the charge path along said rows as measured by number of pixels traveled.

3. The imager of claim 1 wherein said charge transfer locations comprise charge coupled devices.

4. The imager of claim 3 wherein said charge transfer locations comprise virtual phase charge coupled devices formed with a single level of metalization.

5. The imager of claim 1 wherein said buffer register is arranged in a tree structure such that each branch of the tree structure has the same number of pixels as each corresponding branch.

6. The imager of claim 5 wherein adjacent pairs of said rows are disposed adjacent common portions of a first branch of said buffer register.

7. The imager of claim 6 wherein each pair of said first branches are interconnected with second branches of said buffer register.

8. The imager of claim 1 and further comprising a line addressing circuit for arbitrarily selecting any one of said rows of said array for read-out.

9. The imager of claim 1 and further comprising a line addressing circuit for sequentially selecting any one of said rows of said array for read-out.

10. A charge transfer imager for use with a television system having read-out and blanking cycles comprising:

an imaging array having a plurality of rows of CCDs for storing charge in dependence upon incident light;

addresssing means for selecting any desired row for read-out;

a buffer register disposed adjacent the ends of said rows and having a plurality of paths;

means for clocking charge in a selected row from said row and along said buffer register;

output means connected to said buffer register for receiving charge clocked through said buffer register along each of said paths; and said buffer register configured such that the same amount of time or number of clock pulses is required to clock along each path of said buffer register to said output means.

11. The charge transfer imager of claim 9 wherein said rows are selected for read-out during the blanking cycle of the television system.

12. The imager of claim 9 wherein the length of the path traveled by each charge along said buffer register is equal to the length of the charge path along said rows as measured by number of pixels traveled.

13. The imager of claim 9 wherein said buffer register is arranged in a tree structure such that each corresponding branch of the tree structure has the same length as measured in number of pixels.

14. The imager of claim 12 wherein adjacent pairs of rows are disposed adjacent common portions of a first branch of said buffer register.

15. The imager in claim 13 wherein each pair of said first branches are interconnected with second branches of said buffer register.

* * * * *